(12) United States Patent
Liou et al.

(10) Patent No.: US 11,276,655 B2
(45) Date of Patent: Mar. 15, 2022

(54) GROUND REFERENCE SHAPE FOR HIGH SPEED INTERCONNECT

(71) Applicant: Innogrit Technologies Co., Ltd., Shanghai (CN)

(72) Inventors: Shiann-Ming Liou, Campbell, CA (US); Gang Zhao, Chandler, AZ (US)

(73) Assignee: InnogritTechnologies Co., Ltd., Shanghai (CN)

( * ) Notice: Subject to any disclaimer, the term of this patent is extended or adjusted under 35 U.S.C. 154(b) by 0 days.

(21) Appl. No.: 16/881,750

(22) Filed: May 22, 2020

(65) Prior Publication Data

US 2021/0366848 A1 Nov. 25, 2021

(51) Int. Cl.
*H01L 23/66* (2006.01)
*H01L 23/00* (2006.01)
*H01L 23/552* (2006.01)
*H01L 21/48* (2006.01)

(52) U.S. Cl.
CPC .......... *H01L 23/66* (2013.01); *H01L 21/4853* (2013.01); *H01L 23/552* (2013.01); *H01L 24/48* (2013.01); *H01L 2223/6611* (2013.01); *H01L 2223/6638* (2013.01); *H01L 2224/48227* (2013.01); *H01L 2924/3025* (2013.01)

(58) Field of Classification Search
CPC .... H01L 23/66; H01L 21/4853; H01L 23/552
See application file for complete search history.

(56) References Cited

U.S. PATENT DOCUMENTS

| | | | |
|---|---|---|---|
| 9,362,209 B1 | 6/2016 | Mangrum | |
| 2006/0028378 A1 | 2/2006 | Gaucher et al. | |
| 2006/0200977 A1 | 9/2006 | Lauffer et al. | |
| 2009/0039986 A1* | 2/2009 | Kamgaing | H01P 1/212 333/24 C |
| 2013/0134579 A1* | 5/2013 | Howard | H01L 24/49 257/737 |

* cited by examiner

*Primary Examiner* — Errol V Fernandes
(74) *Attorney, Agent, or Firm* — IPRO, PLLC; Xiaomin Huang

(57) ABSTRACT

Apparatus and methods are provided for providing provide high-speed interconnect using bond wires. According to various aspects of the subject innovation, the provided techniques may provide a ground shape to shield a high-speed signal wire from the substrate in a semiconductor assembly. In an exemplary embodiment, there is provided an assembly that may comprise a substrate, a semiconductor die attached to the substrate, a signal bond wire connecting a bond pad on the semiconductor die and a bond finger on the substrate, and a ground shape on the substrate to shield the signal wire from the substrate.

20 Claims, 2 Drawing Sheets

GROUND REFERENCE SHAPE FOR HIGH SPEED INTERCONNECT

TECHNICAL FIELD

The disclosure herein relates to high speed connection, particularly relates to high speed interconnect for a semiconductor package.

BACKGROUND

For semiconductor package interconnect, shortening the bonding wire is the common practice that is normally used to tackle high-speed signal. Another approach is to run ground wires in parallel with the high-speed signal. However, shortening the bonding wire and running ground wires are not enough to satisfy the requirement of modern high-speed interface technology, such as PCIe Gen 4 with 16 Gb/s or beyond. The conventional wisdom of handling high speed signals like high speed Ser/Des difference pairs is to use flipped chip ball grid array package (FCBGA). FCBGA can provide good impedance control and isolations but requires higher package/assembly costs compared to bond wire interconnect.

SUMMARY

A continuing need exists for improved bond wire interconnect. The disclosed subject matter relates to apparatuses and methods that provide high-speed interconnect using bond wires. According to various aspects of the subject innovation, the provided techniques may form a ground shape to shield a high-speed signal wire from the substrate in a semiconductor assembly. Moreover, the provided techniques may form ground shapes in trapezoid shapes to shield respective differential pairs of high-speed signal wires from the substrate in a semiconductor assembly with the trapezoid shapes shorted at both bases.

In an exemplary embodiment, there is provided an assembly. The assembly may comprise a substrate, a semiconductor die attached to the substrate, a signal bond wire connecting a bond pad on the semiconductor die and a bond finger on the substrate, and a ground shape on the substrate to shield the signal wire from the substrate.

In another exemplary embodiment, there is provided an assembly. The assembly may comprise a substrate, a semiconductor die attached to the substrate, a pair of bond wires each connecting a respective bond pad on the semiconductor die and a respective bond finger on the substrate, and a ground shape on the substrate to shield the pair of bond wires from the substrate.

In yet another exemplary embodiment, there is provide a method for making a semiconductor assembly. The method may comprise forming a ground shape on a substrate and bonding a semiconductor die on the substrate with a signal wire connecting a bond pad on the semiconductor die and a bond finger on the substrate. The ground shape may extend from a die footprint to the bond finger on the substrate and the signal wire may be shielded from the substrate by the ground shape.

DETAILED DESCRIPTION

Figure 1:
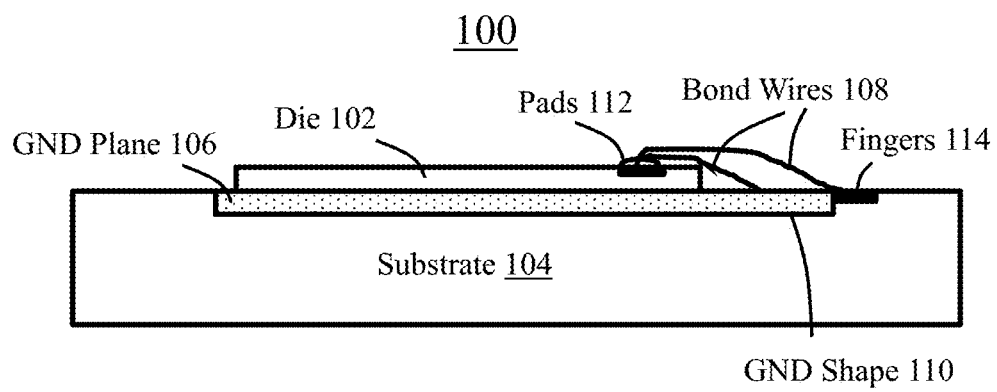
FIG. 1 schematically shows a cross-sectional view of a semiconductor assembly in accordance with an embodiment of the present disclosure.

Specific embodiments according to the present disclosure will now be described in detail with reference to the accompanying figures. Like elements in the various figures are denoted by like reference numerals for consistency.

An exemplary embodiment according to the present disclosure may provide an assembly that may comprise a substrate and a semiconductor die attached to the substrate. The assembly may have one signal bond wire connecting a bond pad on the semiconductor die and a bond finger on the substrate and a ground shape on the substrate to shield the signal wire from the substrate. Another exemplary embodiment according to the present disclosure may provide an assembly that may comprise a substrate, a semiconductor die attached to the substrate, a pair of bond wires each connecting a respective bond pad on the semiconductor die and a respective bond finger on the substrate, and a ground shape on the substrate to shield the pair of bond wires from the substrate.

FIG. 1 schematically shows a cross-sectional view of a semiconductor assembly 100 in accordance with an embodiment of the present disclosure. The semiconductor assembly 100 may comprise a die 102, a substrate 104, a ground plane 106, a ground shape 110, a plurality of bond wires 108 connected between a plurality of bond pads 112 on the die 102 and bond fingers 114 on the substrate. In one embodiment, the die 102 may be a semiconductor die with integrated circuit (IC). The substrate 104 may be a package substrate used for semiconductor package. The ground plane 106 may cover a footprint of the die 102 on the substrate 104 and may be referred to as a ground reference plane in some embodiments. It should be noted that the semiconductor assembly 100 may have other layers, which may be omitted for simplicity, for example, mold compound to encapsulate the die. It also should be noted that each of the bond wires 108 is connected between one respective bond pad 112 on the die 102 and one respective bond finger 114 on the substrate 104.

In FIG. 1, the ground shape 110 may be on the substrate 104 and shown to be part of the ground plane 106. In one embodiment, the ground shape 110 may be an extension of the ground plane 106 protruding from an edge of the ground plane 106 towards the bond finger 114. In some embodiments, there may be a plurality of ground shapes 110 and each of the ground shapes 110 may be an extension protruding from an edge of the ground plane 106 towards where bond fingers 114 may be located. Some of the bond wires 108 may be for signals and some of the bond wires 108 may be for ground wires. In an embodiment, the fingers bonded to by the ground wires 108 may be coupled to a ground shape 110. In some embodiments, the ground shape 110 and the ground plane 106 may be on a top surface of the substrate 104. In some other embodiments, the ground shape 110 and the ground plane 106 may be close to a top surface of the substrate 104 but there may be other layers on top of the ground shape 110 and the ground plane 106, such as, but not limited to, a sealing layer and/or an insulation layer.

Figure 2:
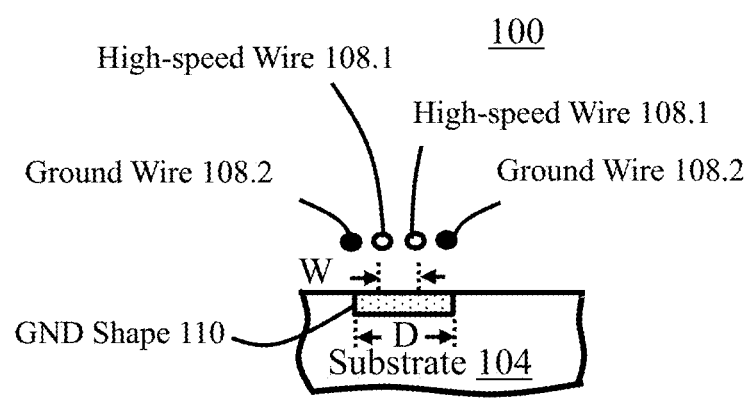
FIG. 2 schematically shows a cross-sectional view of a portion of the semiconductor assembly in accordance with an embodiment of the present disclosure.

FIG. 2 schematically shows a cross-sectional view of a portion of the semiconductor assembly 100 in accordance with an embodiment of the present disclosure. The ground shape 110 may be located on the substrate 104 and configured to shield the high-speed wires 108.1 from the substrate 104. In addition to the ground shape 110, the high-speed wires 108.1 may also be accompanied a pair of ground wires 108.2. The pair of ground wires 108.2 may be sided along two respective sides of the differential pair of signal bond wires 108.1. The ground shape 110 may enhance the isolation and help further reduce noise coupling for the signal bond wires 108.1. In one embodiment, the high-speed wires 108.1 may be a differential pair of signal bond wires.

As shown in FIG. 2, the ground shape 110 may have a width D. The width D may be at least as wide as a distance W between the signal wires of the differential pair of signal bond wires 108.1. That is, the width D may be equal to or larger than the distance W. It should be noted that the signal wires of the differential pair of signal bond wires 108.1 does not need to be parallel and such that the distance W between the signal wires of the differential pair of signal bond wires 108.1 is not necessarily a single value. Therefore, the width D is not necessarily a single value either. But at any point along the signal wires of the differential pair of signal bond wires 108.1, the width D of the ground shape 110 may be equal to or larger than the distance D and covers a span equal to or larger than the span of the orthogonal projections of the differential pair of signal bond wires 108.1 on the substrate 104. In some embodiments, the width D may be as wide as the distance of the orthogonal projections of the ground wires 108.2 on the substrate 104.

It should be noted that although FIG. 2 shows a differential pair of signal bond wires 108.1 shielded from the substrate 104 by the ground shape 110. One embodiment may have a ground shape 110 to shield one signal bond wire from the substrate.

Figure 3:
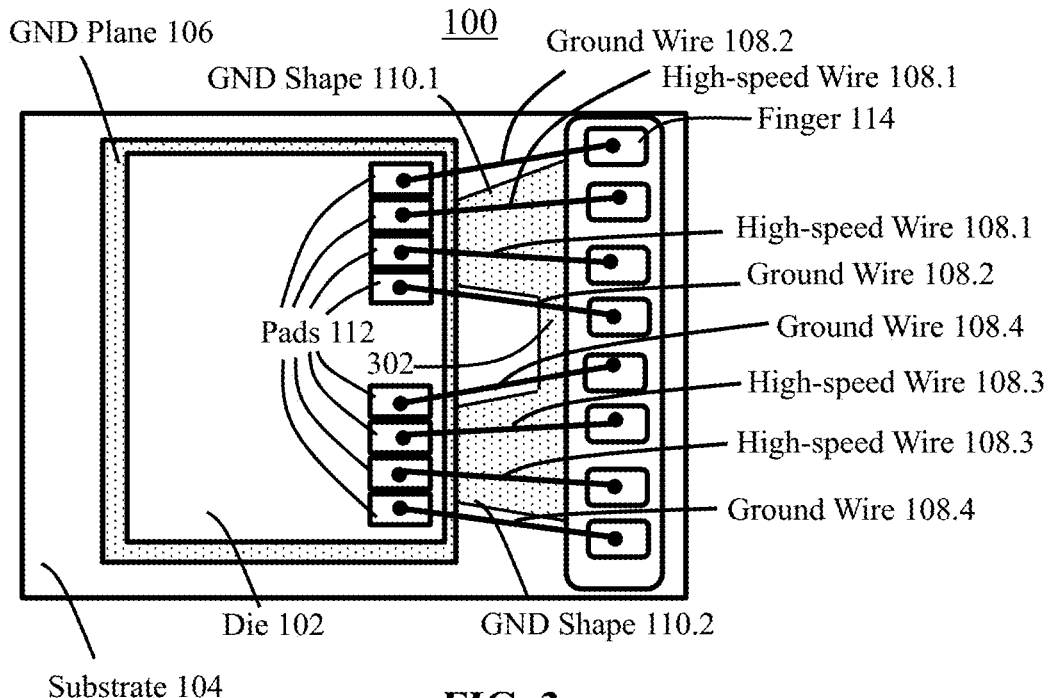
FIG. 3 schematically shows a top view of a semiconductor assembly in accordance with an embodiment of the present disclosure.

FIG. 3 schematically shows a top view of a semiconductor assembly 100 in accordance with an embodiment of the present disclosure. The die 102 may comprise a plurality of bond pads 112. The substrate 104 may comprise a plurality of bond fingers 104. For simplicity, only one bond finger 114 is labeled. The two high-speed wires 108.1 may be a first differential pair of signal bond wires and accompanied by a first pair of ground wires 108.2. The two high-speed wires 108.3 may be a second differential pair of signal bond wires and accompanied by a second pair of ground wires 108.4. Each of the high-speed wires and the ground wires may be connected between a respective bond bad 112 on the die 102 and a respective bond finger 114 on the substrate 104.

The ground shape 110.1 may be a first ground shape on the substrate 104 to shield the first differential pair of signal bond wires 108.1 from the substrate 104. The ground shape 110.1 may have a trapezoid shape with a first base coupled to the ground plane 106 and a second base by the bond finger side. The distance between two lateral sides of the trapezoid shape of the ground shape 110.1 at any point may be larger than the distance between the high-speed wires 108.1 at the same point along the high-speed wires 108.1. In an embodiment, the fingers 114 bonded to by the ground wires 108.2 may be coupled to the ground shape 110.1 and the fingers 114 bonded to by the high-speed wires 108.1 may be insulated from the ground shape 110.1.

The ground shape 110.2 may be a second ground shape on the substrate 104 to shield the second differential pair of signal bond wires 108.3 from the substrate 104. The ground shape 110.2 may also have a trapezoid shape with a first base coupled to the ground plane 106 and a second base by the bond finger side. The distance between two lateral sides of the trapezoid shape of the ground shape 110.2 at any point may be larger than the distance between the high-speed wires 108.3 at the same point along the high-speed wires 108.3. In an embodiment, the fingers 114 bonded to by the ground wires 108.4 may be coupled to the ground shape 110.2 and the fingers 114 bonded to by the high-speed wires 108.3 may be insulated from the ground shape 110.2.

In one embodiment, the ground shape 110.1 and ground shape 110.2 may be electrically shorted by a bridge 302. That is, the ground shape 110.1 and ground shape 110.2 may be shorted at both trapezoid bases: at one base by the ground plane 106 and at another base by the bridge 302. It should be noted that although FIG. 3 shows two ground shapes 110.1 and 110.2 to provide shielding for the differential pairs of signal bond wires 108.1 and 108.3, in one embodiment, there may be more than two pairs of differential pairs of signal bond wires, and each differential pair of signal bond wires may be shielded by a respective ground shape on the substrate. Each of the plurality ground shapes may have a trapezoid shape with one base coupled to the ground plane and another base by the bond finger side shorted with adjacent ground shapes by bridges 302 between any two adjacent ground shapes.

Figure 4:
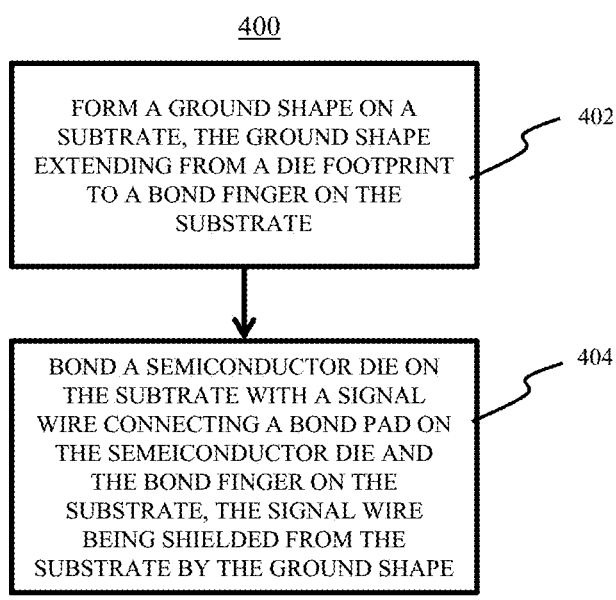
FIG. 4 is a flowchart of a process for making a semiconductor assembly in accordance with an embodiment of the present disclosure.

FIG. 4 is a flowchart of a process 400 for making a semiconductor assembly in accordance with an embodiment of the present disclosure. At block 402, a ground shape may be formed on a substrate. In one embodiment, the ground shape may extend from a die footprint to a bond finger on the substrate. At block 404, a semiconductor die may be bonded on the substrate with a signal wire connecting a bond pad on the semiconductor die and a bond finger on the substrate. The signal wire may be shielded from the substrate by the ground shape. In one embodiment, the bond wire may be one of a differential pair of signal bond wires, and the ground shape may be shaped to be at least as wide as a distance between two signal wires of the differential pair of signal bond wires to shield both signal wires of the differential pair of signal bond wires from the substrate. In one embodiment, a pair of ground wires may be bonded between respective ground signal pads on the die and respective ground fingers on the substrate. The pair of ground wires may be sided along two respective sides of the differential pair of signal bond wires. The ground shape may have a trapezoid shape with a first base by the bond pad and a second base by the bond finger In some embodiments, the process 400 may further comprise forming a second ground shape on the substrate, bonding a second differential pair of signal bond wires between respective bond pads on the semiconductor die and respective bond fingers on the substrate and bonding a second pair of ground wires sided along two respective sides of the second differential pair of signal bond wires. The second ground shape may have a trapezoid shape and two lateral sides of the trapezoid may have a width at least as wide as a distance between two signal wires of the second differential pair of signal bond wires, and a second base of the second ground shape is shorted with a second base of the first ground shape.

In some embodiments, the process 400 may further comprise forming a ground reference plane to cover the die footprint. The ground shapes may be extensions of the ground reference plane protruding from an edge of the ground reference plane at the die footprint towards bond fingers on the substrate. It should be noted that in some embodiments, the ground reference plane and the ground shapes may be formed together using known and yet to be developed techniques for forming conductive patterns on a substrate that may be insulated from other parts of the substrate. The ground reference plane and the ground shapes may be formed using the same or different conductive material, such as, but not limited to, copper and gold.

In an exemplary embodiment, there is provided an assembly. The assembly may comprise a substrate, a semiconductor die attached to the substrate, a signal bond wire connecting a bond pad on the semiconductor die and a bond finger on the substrate, and a ground shape on the substrate to shield the signal wire from the substrate.

In one embodiment, the signal bond wire may be one of a first differential pair of signal bond wires and the ground shape may be shaped to be at least as wide as a distance between two wires of the first differential pair of signal bond wires.

In one embodiment, the assembly may further comprise a first pair of ground wires sided along two respective sides of the first differential pair of signal bond wires.

In one embodiment, the ground shape may have a trapezoid shape with a first base by the bond pad and a second base by the bond finger.

In one embodiment, the assembly may further comprise a second differential pair of signal bond wires and a second ground shape. The second ground shape may be shaped to be at least as wide as a distance between two wires of the second differential pair of signal bond wires.

In one embodiment, the assembly may further comprise a second pair of ground wires sided along two respective sides of the second differential pair of signal bond wires. The second ground shape may also have a trapezoid shape and its second base may be shorted with the second base of the first ground shape.

In one embodiment, the substrate may be a package substrate.

In one embodiment, the substrate may include a ground reference plane underneath the semiconductor die. The ground reference plane may cover a footprint of the semiconductor die on the substrate, and the ground shape may be an extension of the ground reference plane protruding from an edge of the ground reference plane at the die towards the bond finger on the substrate.

In another exemplary embodiment, there is provided an assembly. The assembly may comprise a substrate, a semiconductor die attached to the substrate, a pair of bond wires each connecting a respective bond pad on the semiconductor die and a respective bond finger on the substrate, and a ground shape on the substrate to shield the pair of bond wires from the substrate.

In one embodiment, the pair of bond wires may be a differential pair of signal wires. The assembly may further comprise a pair of ground wires sided along two respective sides of the differential pair of signal bond wires, and the ground shape may have a trapezoid shape with a first base by the die and a second base by bond fingers.

In one embodiment, the assembly may further comprise a second differential pair of signal bond wires and a second ground shape. The second ground shape may be shaped to be at least as wide as a distance between two wires of the second differential pair of signal bond wires.

In one embodiment, the assembly may further comprise a second pair of ground wires sided along two respective sides of the second differential pair of signal bond wires. The second ground shape may also have a trapezoid shape and its second base may be shorted with the second base of the first ground shape.

In one embodiment, the substrate may include a ground reference plane underneath the semiconductor die. The ground reference plane may cover a footprint of the semiconductor die on the substrate. The ground shape and the second ground shape may be extensions of the ground reference plane protruding from an edge of the ground reference plane at the die towards bond fingers on the substrate.

In one embodiment, the substrate may be a package substrate.

In yet another exemplary embodiment, there is provide a method for making a semiconductor assembly. The method may comprise forming a ground shape on a substrate and bonding a semiconductor die on the substrate with a signal wire connecting a bond pad on the semiconductor die and a bond finger on the substrate. The ground shape may extend from a die footprint to the bond finger on the substrate and the signal wire may be shielded from the substrate by the ground shape.

In one embodiment, the bond wire may be one of a differential pair of signal bond wires, and the ground shape may be shaped to be at least as wide as a distance between two signal wires of the differential pair of signal bond wires to shield both signal wires of the differential pair of signal bond wires from the substrate.

In one embodiment, the method may further comprise bonding a pair of ground wires sided along two respective sides of the differential pair of signal bond wires.

In one embodiment, the ground shape may have a trapezoid shape with a first base by the bond pad and a second base by the bond finger.

In one embodiment, the method may further comprise forming a second ground shape on the substrate, bonding a second differential pair of signal bond wires between respective bond pads on the semiconductor die and respective bond fingers on the substrate and bonding a second pair of ground wires sided along two respective sides of the second differential pair of signal bond wires. The second ground shape may have a trapezoid shape and two lateral sides of the trapezoid may have a width at least as wide as a distance between two signal wires of the second differential pair of signal bond wires. A second base of the second ground shape may be shorted with a second base of the first ground shape.

In one embodiment, the method may further comprise forming a ground reference plane to cover the die footprint. The ground shape and the second ground shape may be two extensions of the ground reference plane protruding from an edge of the ground reference plane at the die footprint towards bond fingers on the substrate.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The terms "coupled to," along with its derivatives, may be used herein. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

The terms chip, die, integrated circuit, monolithic device, semiconductor device, and microelectronic device are often used interchangeably in the microelectronics field. The present invention is applicable to all of the above as they are generally understood in the field.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An assembly, comprising:
    a substrate;
    a semiconductor die attached to the substrate;
    a signal bond wire connecting a bond pad on the semiconductor die and a bond finger on the substrate; and
    a ground shape on the substrate extending from a die footprint along the signal wire to the bond finger to shield the signal wire from the substrate.

2. The assembly of claim 1, wherein the signal bond wire is one of a first differential pair of signal bond wires and the ground shape is shaped to be at least as wide as a distance between two wires of the first differential pair of signal bond wires.

3. The assembly of claim 2, further comprising a first pair of ground wires sided along two respective sides of the first differential pair of signal bond wires.

4. The assembly of claim 3, wherein the ground shape has a trapezoid shape with a first base by the bond pad and a second base by the bond finger.

5. The assembly of claim 4, further comprising a second differential pair of signal bond wires and a second ground shape, wherein the second ground shape is shaped to be at least as wide as a distance between two wires of the second differential pair of signal bond wires.

6. The assembly of claim 5, further comprising a second pair of ground wires sided along two respective sides of the second differential pair of signal bond wires, wherein the second ground shape also has a trapezoid shape and its second base is shorted with the second base of the first ground shape.

7. The assembly of claim 1, wherein the substrate is a package substrate.

8. The assembly of claim 1, wherein the substrate includes a ground reference plane underneath the semiconductor die, the ground reference plane covers a footprint of the semiconductor die on the substrate, the ground shape is an extension of the ground reference plane protruding from an edge of the ground reference plane at the die towards the bond finger on the substrate.

9. An assembly, comprising:
    a substrate;
    a semiconductor die attached to the substrate;
    a pair of bond wires each connecting a respective bond pad on the semiconductor die and a respective bond finger on the substrate; and
    a ground shape on the substrate extending from a die footprint along the pair of bond wires to the respective bond fingers to shield the pair of bond wires from the substrate.

10. The assembly of claim 9, wherein the pair of bond wires are a differential pair of signal wires, the assembly further comprises a pair of ground wires sided along two respective sides of the differential pair of signal bond wires, and wherein the ground shape has a trapezoid shape with a first base by the die and a second base by bond fingers.

11. The assembly of claim 10, further comprising a second differential pair of signal bond wires and a second ground shape, wherein the second ground shape is shaped to be at least as wide as a distance between two wires of the second differential pair of signal bond wires.

12. The assembly of claim 11, further comprising a second pair of ground wires sided along two respective sides of the second differential pair of signal bond wires, wherein the second ground shape also has a trapezoid shape and its second base is shorted with the second base of the first ground shape.

13. The assembly of claim 12, wherein the substrate includes a ground reference plane underneath the semiconductor die, the ground reference plane covers a footprint of the semiconductor die on the substrate, the ground shape and the second ground shape are extensions of the ground reference plane protruding from an edge of the ground reference plane at the die towards bond fingers on the substrate.

14. The assembly of claim 9, wherein the substrate is a package substrate.

15. A method for making a semiconductor assembly, comprising:
    forming a ground shape on a substrate, the ground shape extending from a die footprint to a bond finger on the substrate; and
    bonding a semiconductor die on the substrate with a signal wire connecting a bond pad on the semiconductor die and the bond finger on the substrate, the signal wire being shielded from the substrate by the ground shape.

16. The method of claim 15, wherein the bond wire is one of a differential pair of signal bond wires, and the ground shape is shaped to be at least as wide as a distance between two signal wires of the differential pair of signal bond wires to shield both signal wires of the differential pair of signal bond wires from the substrate.

17. The method of claim 16, further comprising bonding a pair of ground wires sided along two respective sides of the differential pair of signal bond wires.

18. The method of claim 17, wherein the ground shape has a trapezoid shape with a first base by the bond pad and a second base by the bond finger.

19. The method of claim 18, further comprising:
    forming a second ground shape on the substrate;
    bonding a second differential pair of signal bond wires between respective bond pads on the semiconductor die and respective bond fingers on the substrate; and
    bonding a second pair of ground wires sided along two respective sides of the second differential pair of signal bond wires, wherein the second ground shape has a trapezoid shape and two lateral sides of the trapezoid has a width at least as wide as a distance between two signal wires of the second differential pair of signal bond wires, wherein a second base of the second ground shape is shorted with a second base of the first ground shape.

20. The method of claim 19, further comprising forming a ground reference plane to cover the die footprint, wherein the ground shape and the second ground shape are two extensions of the ground reference plane protruding from an edge of the ground reference plane at the die footprint towards bond fingers on the substrate.

\* \* \* \* \*